United States Patent
Ishibashi et al.

(10) Patent No.: US 7,851,381 B2
(45) Date of Patent: Dec. 14, 2010

(54) SURFACE TREATMENT METHOD FOR NITRIDE CRYSTAL, NITRIDE CRYSTAL SUBSTRATE, NITRIDE CRYSTAL SUBSTRATE WITH EPITAXIAL LAYER AND SEMICONDUCTOR DEVICE, AND METHOD OF MANUFACTURING NITRIDE CRYSTAL SUBSTRATE WITH EPITAXIAL LAYER AND SEMICONDUCTOR DEVICE

(75) Inventors: Keiji Ishibashi, Itami (JP); Takayuki Nishiura, Itami (JP); Masato Irikura, Itami (JP); Seiji Nakahata, Itami (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 237 days.

(21) Appl. No.: 11/806,317

(22) Filed: May 31, 2007

(65) Prior Publication Data

US 2007/0281484 A1 Dec. 6, 2007

(30) Foreign Application Priority Data

May 31, 2006 (JP) ............................. 2006-151876
May 8, 2007 (JP) ............................. 2007-123731

(51) Int. Cl.
- H01L 21/304 (2006.01)
- B24D 3/02 (2006.01)
- B24B 57/00 (2006.01)

(52) U.S. Cl. ..................................... 438/765; 438/959
(58) Field of Classification Search .................. None
See application file for complete search history.

(56) References Cited

U.S. PATENT DOCUMENTS

| 5,814,157 | A | 9/1998 | Mizuniwa et al. |
| 6,488,767 | B1 | 12/2002 | Xu et al. |
| 6,596,079 | B1 | 7/2003 | Vaudo et al. |
| 6,951,695 | B2 | 10/2005 | Xu et al. |
| 2003/0203553 | A1 | 10/2003 | Kubo |
| 2005/0126080 | A1* | 6/2005 | Kon et al. ................ 51/308 |

(Continued)

FOREIGN PATENT DOCUMENTS

CN  1452219  10/2003

(Continued)

OTHER PUBLICATIONS

European Search Report issued in European Patent Application No. EP 07 01 0089.6 dated Oct. 27, 2009.

(Continued)

*Primary Examiner*—Zandra Smith
*Assistant Examiner*—Pamela E Perkins
(74) *Attorney, Agent, or Firm*—McDermott Will & Emery LLP (57) ABSTRACT

A surface treatment method for a nitride crystal is a surface treatment method of chemically and mechanically polishing a surface of the nitride crystal. Oxide abrasive grains are used. The abrasive grains have a standard free energy of formation of at least −850 kJ/mol as a converted value per 1 mole of oxygen molecules and have a Mohs hardness of at least 4. The surface treatment method efficiently provides, for efficiently obtaining a nitride crystal substrate that can be used for a semiconductor device, the nitride crystal having the smooth and high-quality surface formed thereon.

15 Claims, 4 Drawing Sheets

U.S. PATENT DOCUMENTS

| | | |
|---|---|---|
| 2006/0029832 A1 | 2/2006 | Xu et al. |
| 2006/0236922 A1* | 10/2006 | Ishibashi et al. .............. 117/94 |

FOREIGN PATENT DOCUMENTS

| | | | |
|---|---|---|---|
| CN | 1541287 | | 10/2004 |
| EP | 1 717 286 A | | 11/2006 |
| EP | 1 736 574 A | | 12/2006 |
| EP | 1 821 339 A | | 8/2007 |
| EP | 1 852 480 A | | 11/2007 |
| EP | 2 039 474 A | | 3/2009 |
| EP | 2 080 823 A | | 7/2009 |
| JP | 2000-061847 | * | 2/2000 |
| JP | 2001-322899 | | 11/2001 |
| JP | 2006-060074 | | 3/2006 |
| WO | WO 02/101121 A1 | | 12/2002 |

OTHER PUBLICATIONS

Chinese Office Action, with English Translation, issued in Chinese Patent Application No. CN 200710108825.5, dated Apr. 3, 2009.

* cited by examiner

SURFACE TREATMENT METHOD FOR NITRIDE CRYSTAL, NITRIDE CRYSTAL SUBSTRATE, NITRIDE CRYSTAL SUBSTRATE WITH EPITAXIAL LAYER AND SEMICONDUCTOR DEVICE, AND METHOD OF MANUFACTURING NITRIDE CRYSTAL SUBSTRATE WITH EPITAXIAL LAYER AND SEMICONDUCTOR DEVICE

BACKGROUND OF THE INVENTION

1. Field of the Invention

The present invention relates to a surface treatment method for a nitride crystal used for a substrate for example of such a semiconductor device as light-emitting device, electronic device and semiconductor sensor. Further, the invention relates to a nitride crystal substrate obtained using the surface treatment method for the nitride crystal and relates to a semiconductor device including the nitride crystal substrate and a method of manufacturing the semiconductor device.

2. Description of the Background Art

A nitride crystal, particularly a group III nitride crystal such as GaN crystal and AlN crystal is very useful as a material for forming a substrate of a semiconductor device such as light-emitting device, electronic device and semiconductor sensor. Here, the nitride crystal refers to a crystal made of a nitride and includes, as a typical one, a group III nitride crystal. The group III nitride crystal refers to a crystal made of a group III element and nitrogen and includes, for example, $Ga_xAl_yIn_{1-x-y}N$ crystal ($0 \leq x$, $0 \leq y$, $x+y \leq 1$).

A nitride crystal substrate used as a substrate of a semiconductor device is obtained by shaping the outer periphery of a nitride crystal and thereafter slicing the crystal to obtain a piece of the crystal having a predetermined thickness, and grinding or lapping the surface. However, the slicing, grinding or lapping causes a surface region of the nitride crystal to have a thick work-affected layer (referring to a layer having a disordered crystal lattice formed in the surface region of the crystal, due to grinding or polishing of the crystal surface, which is applied as well in the following description), or the nitride crystal has an increased surface roughness. As the thickness of the work-affected layer of the nitride crystal substrate is larger and as the surface roughness is larger, the quality of the substrate surface is deteriorated. Further, the surface of a group III nitride crystal layer epitaxially grown on the nitride crystal surface has a large roughness and the crystallinity is deteriorated. Therefore, a semiconductor device of good quality cannot be formed.

Accordingly, as a method of forming a nitride crystal substrate from a nitride crystal, it has been done widely to slice a nitride crystal into a piece having a predetermined thickness, grind or lap the surface and further perform dry etching (see for example Japanese Patent Laying-Open No. 2001-322899) or chemical mechanical polishing (hereinafter CMP) of the surface (see for example U.S. Pat. Nos. 6,596,079 and 6,488,767), thereby removing the work-affected layer and further reducing the surface roughness.

Although the method of dry-etching the surface of the group III nitride crystal substrate can remove the work-affected layer, it is difficult to further reduce the surface roughness.

Moreover, the conventional CMP polishes the surface of the nitride crystal by supplying, to a polishing pad, a slurry including abrasive grains of a lower hardness than that of the nitride crystal to be polished, while pressing the nitride crystal against the polishing pad. However, since the nitride crystal is hard and relatively slow in response, the conventional CMP is considerably low in polishing speed and efficiency.

SUMMARY OF THE INVENTION

An object of the present invention is to provide a surface treatment method for a nitride crystal by which a smooth and high-quality surface of the nitride crystal is efficiently formed, in order to efficiently obtain a nitride crystal substrate that can be used for a semiconductor device.

The present invention is a surface treatment method of chemically and mechanically polishing a surface of a nitride crystal, using abrasive grains of an oxide, the abrasive grains having a standard free energy of formation of at least −850 kJ/mol as a converted value per 1 mole of oxygen molecules, and the abrasive grains having a Mohs hardness of at least 4.

According to the surface treatment method for the nitride crystal of the present invention, the abrasive grains are dispersed in a solvent to be used as a slurry, and a pH value x and an oxidation-reduction potential value y (mV) of the slurry may satisfy both of relations (i) and (ii):

$$y \geq -50x + 1000 \quad \text{(i); and,}$$

$$y \leq -50x + 1900 \quad \text{(ii).}$$

Further, the slurry may have a pH of at most 5 or at least 9. Furthermore, the abrasive grains may be abrasive grains containing at least one chemical species selected from the group consisting of $Fe_2O_3$, $Fe_3O_4$, NiO, ZnO, CoO, $CO_3O_4$, $GeO_2$, $Ga_2O_3$, $In_2O_3$, $Cr_2O_3$ and $SnO_2$.

According to the surface treatment method for the nitride crystal of the present invention, at least any of the processes may be performed in which the surface of the nitride crystal that is chemically and mechanically polished is scrub-cleaned using a neutral detergent, the surface of the nitride crystal that is chemically and mechanically polished is polished using a basic solution or acid solution, and the surface of the nitride crystal that is chemically and mechanically polished is cleaned with pure water.

According to the surface treatment method for the nitride crystal of the present invention, the surface of the nitride crystal is subjected to grinding or lapping before chemically and mechanically polished.

The present invention is a nitride crystal substrate obtained by the surface treatment method as described above. The nitride crystal substrate of the present invention may have a surface roughness Ry of at most 30 nm and/or a surface roughness Ra of at most 3 nm. Further, an off angle formed by a main surface of the nitride crystal substrate and any of {0001} plane, {11-20} plane, {01-12} plane, {10-10} plane, {10-11} plane, {11-21} plane and {11-22} plane of a wurtzite structure may be at most 15°.

The present invention is a nitride crystal substrate having an epitaxial layer, including a group III nitride layer of at least one layer formed through epitaxial growth on at least one main surface of the nitride crystal substrate. Further, the present invention is a semiconductor device including the nitride crystal substrate and a group III nitride layer of at least one layer formed on at least one main surface of the nitride crystal substrate. Further, the present invention is a method of manufacturing a nitride crystal substrate having an epitaxial layer, selecting the above-described nitride crystal substrate as a substrate and growing a group III nitride layer of at least one layer on at least one main surface of the nitride crystal substrate. Moreover, the present invention is a method of manufacturing a semiconductor device, selecting the above-described nitride crystal substrate as a substrate and growing a group III nitride layer of at least one layer on at least one main surface of the nitride crystal substrate.

In accordance with the present invention, the surface treatment method for the nitride crystal can be provided by which the smooth and high-quality surface of the nitride crystal is efficiently formed, in order to efficiently obtain the nitride crystal substrate that can be used for the semiconductor device.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

First Embodiment

Figure 1:
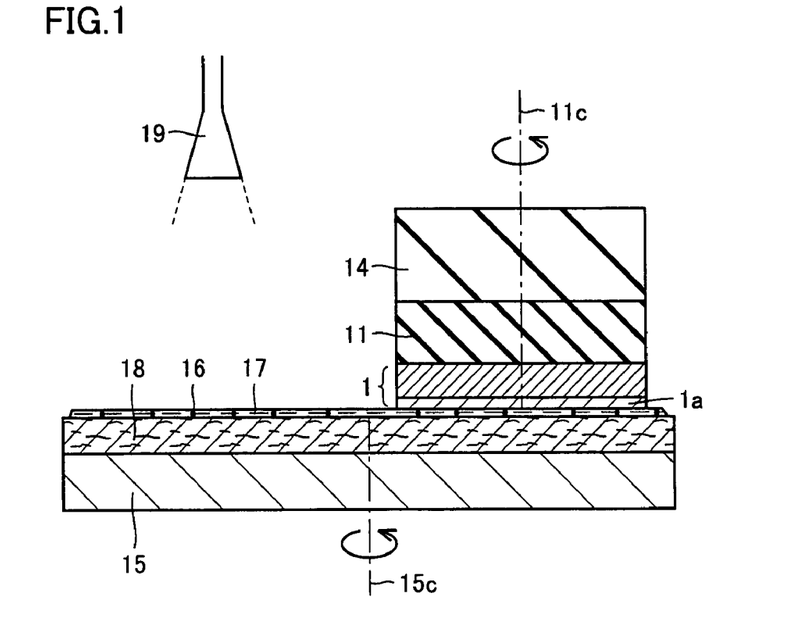
FIG. 1 is a schematic cross section showing an embodiment of a surface treatment method for a nitride crystal according to the present invention.

According to the present invention, referring to FIG. 1, an embodiment of a surface treatment method for a nitride crystal is a surface treatment method that chemically and mechanically polishes a surface of a nitride crystal 1, and features of the embodiment are that oxide abrasive grains 16 are used, the standard free energy of formation of abrasive grains 16 is at least −850 kJ/mol which is the converted value in terms of 1 mole of oxygen molecules, and the Mohs hardness of abrasive grains 16 is at least 4.

In the present embodiment, to chemically and mechanically polish (hereinafter CMP) means chemically and/or mechanically smoothing a surface of a workpiece to be polished. For example, referring to FIG. 1, while a polishing pad 18 fixed on a surface plate 15 is rotated about a rotational axis 15c, a slurry 17 having abrasive grains 16 dispersed therein is supplied from a slurry feed port 19 onto polishing pad 18. On a crystal holder 11 to which nitride crystal 1 is fixed, a weight 14 is placed and crystal holder 11 is rotated about its rotational axis 11c while nitride crystal 1 is pressed against polishing pad 18. In this way, the surface of nitride crystal 1 can be chemically and mechanically polished. Here, polishing refers to the process of making a surface smooth and glossy with a relatively weak load, including polishing that removes a slight amount from the surface, and this polishing is often used as polishing to finish a workpiece to be polished. In contrast to the polishing, rough polishing is referred to as lapping.

In the present embodiment, nitride crystal 1 refers to a crystal made of a nitride and includes, as a typical one, a group III nitride crystal. The group III nitride crystal refers to a crystal made of a group III element and nitrogen and includes, for example, $Ga_xAl_yIn_{1-x-y}N$ crystal ($0 \leq x$, $0 \leq y$, $x+y \leq 1$).

The abrasive grains used for the CMP in the present embodiment are an oxide, have a standard free energy of formation of at least −850 kJ/mol which is the converted value in terms of 1 mole of oxygen molecules. Such abrasive grains made of an oxide and having a high standard free energy of formation as the converted value in terms of 1 mole of oxygen molecules (hereinafter "converted standard free energy of formation") of at least −850 kJ/mol have a strong oxidizing power for a surface of a nitride crystal. Therefore, the abrasive grains provide a high chemical polishing effect on the surface of the nitride crystal.

The standard free energy of formation, which is also called standard Gibbs energy of formation, refers to a Gibbs energy change for a reaction of isothermally (here, 298.15 K as usual) generating 1 mole of a substance (single element, compound) in a standard state ($1 \times 10^5$ Pa) from an element in a standard state of reference, and represented by symbol $\Delta G_f^0$. This amount is calculated, based on the following expression (iv), from a standard enthalpy of formation $\Delta H_f^0$ and a standard entropy of formation $\Delta S_f^0$.

$$\Delta G_f^0 = \Delta H_f^0 - T\Delta S_f^0 \qquad \text{(iv)}$$

In expression (iv), T represents the absolute temperature.

Standard free energy of formation $\Delta G_f^0$ as described above shows, by its definition, a free energy change of reaction, as shown by the following expressions (v) to (viii), depending on differences in valence "m" of an M atom:

$$\text{where } m=1, \ 2M(s)+(\tfrac{1}{2})O_2(g) \rightarrow M_2O(s) \qquad \text{(v)}$$

$$\text{where } m=2, \ M(s)+(\tfrac{1}{2})O_2(g) \rightarrow MO(s) \qquad \text{(vi)}$$

$$\text{where } m=3, \ 2M(s)+(\tfrac{3}{2})O_2(g) \rightarrow M_2O_3(s) \qquad \text{(vii)}$$

$$\text{where } m=4, \ M(s)+O_2(g) \rightarrow MO_2(s) \qquad \text{(viii)}.$$

More specifically, when the valence of the M atom is 1, 2, 3 and 4 respectively, the free energy change is a free energy change of a reaction of generating 1 mole of $M_2O$, MO, $M_2O_3$ and $MO_2$ molecules respectively. Therefore, the number of M atoms and the number of oxygen atoms contained in 1 mole of oxide molecules are different.

Therefore, a standard free energy of formation when M atoms react with 1 mole of oxygen molecules to generate MpOq (p, q are positive integers) is defined as a standard free energy of formation in terms of 1 mole of oxygen molecules (namely converted standard free energy of formation), and represented by symbol $\Delta G_{fO2}^0$. Namely, the converted standard free energy of formation shows a free energy change of a reaction as shown by the following expressions (ix) to (xii) where the valence of the M atom is m.

$$\text{where } m=1, \ 4M(s)+O_2(g) \rightarrow 2M_2O(s) \qquad \text{(ix)}$$

$$\text{where } m=2, \ 2M(s)+O_2(g) \rightarrow 2MO(s) \qquad \text{(x)}$$

$$\text{where } m=3, \ (\tfrac{4}{3})M(s)+O_2(g) \rightarrow (\tfrac{2}{3})M_2O_3(s) \qquad \text{(xi)}$$

$$\text{where } m=4, \ M(s)+O_2(g) \rightarrow MO_2(s) \qquad \text{(xii)}$$

Therefore, converted standard free energy of formation $\Delta G_{fO_2}^0$ is calculated in consideration of a coefficient of an oxygen molecule in expressions (v) to (xii) from standard free energy of formation $\Delta G_f^0$. In expressions (v) to (xii), symbol (s) and symbol (g) shown subsequent to each single element or compound show that the single element or the compound is in a solid state and a gaseous state respectively.

In terms of enhancement of the chemical polishing effects, the converted standard free energy of formation of abrasive grains is preferably at least −800 kJ/mol, more preferably at least −700 kJ/mol and still more preferably at least −600 kJ/mol. If the converted standard free energy of formation of the abrasive grains is at least −700 kJ/mol, abrasive grains of small grain size and low hardness can be used without considerably decreasing the polishing speed and, a crystal surface can be polished efficiently without formation of a work-affected layer in the nitride crystal.

The abrasive grains used for the CMP of the present embodiment have a Mohs hardness of at least 4. Abrasive grains having a Mohs hardness of at least 4 have a mechanical polishing effect on the surface of a nitride crystal. In terms of enhancement of the mechanical polishing effect, the Mohs hardness of the abrasive grains is preferably at least 5, more preferably at least 7 and still more preferably at least 8. In particular, when the abrasive grains have a Mohs hardness of 7 or more, a work-affected layer has a larger thickness while the polishing speed is higher.

Abrasive grains that are commonly used for polishing and lapping are made of diamond, SiC, BN, $Al_2O_3$, $SiO_2$, $ZrO_2$, for example. Abrasive grains made of any of these chemical species are selected in terms of enhancement of the mechanical polishing effect. In terms of increase of the polishing speed, abrasive grains of high hardness and large grain size are used. In terms of reduction in surface roughness and/or work-affected layer, abrasive grains of low hardness and small grain size are used. In order to obtain a smooth and high-quality surface while shortening the polishing time, polishing is performed in multiple steps using multiple types of abrasive grains, starting from abrasive grains of larger grain size and then abrasive grains of smaller grain size.

Since an extremely high surface quality is required for a semiconductor device substrate, $SiO_2$ abrasive grains are chiefly used for polishing of the substrate. As for the $SiO_2$ abrasive grains, the abrasive grains spherical in shape are available and sophisticated grain size control can be made. Therefore, the work-affected layer can be reduced and the surface can be made smooth. For polishing glass, $CeO_2$ abrasive grains are chiefly used. The polishing of the glass with $CeO_2$ abrasive grains has been regarded as the one in which Ce replaces Si of the glass.

However, since a nitride crystal is chemically stable and has a high hardness, use of only the above-described common abrasive grains does not provide the chemical polishing effects on the nitride crystal. For example, diamond abrasive grains, SiC abrasive grains and BN abrasive grains are not oxides and do not have the chemical polishing effects to be obtained from oxidation action on a surface of a nitride crystal. Further, although $Al_2O_3$ abrasive grains, $SiO_2$ abrasive grains, $CeO_2$ abrasive grains and $ZrO_2$ abrasive grains are all oxides, the converted standard free energy of formation is smaller than −850 kJ/mol. Therefore, the chemical polishing effects to be obtained from the oxidation action on the surface of the nitride crystal are considerably low.

Regarding abrasive grains used in the present embodiment, as long as the abrasive grains are oxide, have a converted standard free energy of formation of at least −850 kJ/mol and have a Mohs hardness of at least 4, the abrasive grains are not limited to particular ones. However, in terms of enhancement of surface quality and polishing speed, it is preferable that abrasive grains include at least one chemical species selected from the group consisting of $Fe_2O_3$, $Fe_3O_4$, NiO, ZnO, CoO, $CO_3O_4$, $GeO_2$, $Ga_2O_3$, $In_2O_3$, $Cr_2O_3$ and $SnO_2$.

$Fe_2O_3$ has a converted standard free energy of formation of −570 kJ/mol and a Mohs hardness of 6, $Fe_3O_4$ has a converted standard free energy of formation of −580 kJ/mol and a Mohs hardness of 6, NiO has a converted standard free energy of formation of −500 kJ/mol and a Mohs hardness of 5.5, ZnO has a converted standard free energy of formation of −720 kJ/mol and a Mohs hardness of 4, CoO has a converted standard free energy of formation of −510 kJ/mol and a Mohs hardness of 5, $CO_3O_4$ has a converted standard free energy of formation of −470 kJ/mol and a Mohs hardness of 5, $GeO_2$ has a converted standard free energy of formation of −570 kJ/mol and a Mohs hardness of 5, $Ga_2O_3$ has a converted standard free energy of formation of −740 kJ/mol and a Mohs hardness of 5, $In_2O_3$ has a converted standard free energy of formation of −770 kJ/mol and a Mohs hardness of 5, $Cr_2O_3$ has a converted standard free energy of formation of −770 kJ/mol and a Mohs hardness of 8.5 and $SnO_2$ has a converted standard free energy of formation of −600 kJ/mol and a Mohs hardness of 6.8.

Abrasive grains 16 may be one type of mono-oxide (an oxide containing a single metal element, this term is similarly used hereinafter) or alternatively a mixture of at least two types of mono-oxides. Instead, the abrasive grains may be a multi-oxide (an oxide containing at least two types of metal elements, this term is similarly used hereinafter). Some multi-oxides have such a structure as ferrite structure, perovskite structure, spinel structure or ilmenite structure, for example. Specifically, preferred examples of the multi-oxide are $NiFe_2O_4$ (containing NiO and $Fe_2O_3$ as chemical species), $ZnFe_2O_4$ (containing ZnO and $Fe_2O_3$ as chemical species) and $FeWO_4$ (containing FeO and $WO_3$ as chemical species), for example. $NiFe_2O_4$ has a converted standard free energy of formation of −560 kJ/mol and a Mohs hardness of 5, $ZnFe_2O_4$ has a converted standard free energy of formation of −610 kJ/mol and a Mohs hardness of 6 and $FeWO_4$ has a converted standard free energy of formation of −620 kJ/mol and a Mohs hardness of 4.

According to the surface treatment method for a nitride crystal in the present embodiment, referring to FIG. 1, abrasive grains 16 are dispersed in a solvent to be used as slurry 17. Preferably, value x of the pH and value y (mV) of the oxidation-reduction potential (hereinafter ORP) of slurry 17 satisfy both of the following relations (i) and (ii).

$$y \geq -50x+1000 \qquad (i)$$

$$y \leq -50x+1900 \qquad (ii)$$

Specifically, slurry 17 in the present embodiment has abrasive grains 16 as described above that are dispersed in water which is a dispersion medium. The content of abrasive grains 16 in slurry 17 is not limited to a particular content. In terms of efficient polishing of a surface of a nitride crystal, the slurry content is preferably at least 1% by mass and at most 30% by mass, and more preferably at least 2% by mass and at most 20% by mass.

ORP means an energy level (potential) determined by the state of balance between the oxidant and the reductant coexisting in the solution. An ORP obtained by measurement is a value with respect to a reference electrode. A different type of reference electrode provides a different apparent measurement for the same solution. In general treatises, a normal hydrogen electrode (NHE) is used as the reference electrode in most cases. The ORP here is shown as a value with respect to the normal hydrogen electrode (NBE) used as the reference electrode.

When pH value x and ORP value y (mV) of slurry 17 in the present embodiment satisfy the relation y<−50x+1000, slurry 17 has a week oxidizing power and the polishing speed for the surface of nitride crystal 1 is slow. In contrast, when the relation y>−50x+1900 is satisfied, the oxidizing power of slurry 17 is excessively strong to cause a stronger corrosion action on such polishing tools such as polishing pad and surface plate, resulting in difficulty in accomplishing stable CMP.

In terms of further increasing the polishing speed, it is preferable that the relation y≧−50x+1300 is satisfied. In other words, it is preferable that pH value x and ORP value y (mV) of slurry 17 satisfy both of the following relations represented by expressions (ii) and (iii).

$$y \leq -50x+1900 \quad \text{(ii)}$$

$$y \geq -50x+1300 \quad \text{(iii)}$$

Such acids as hydrochloric acid and sulfuric acid and such bases as KOH and NaOH contained in an ordinary slurry have a weak oxidizing power for a surface of a chemically stable nitride crystal. Therefore, it is preferable that the slurry in the present embodiment contains an oxidizing agent added therein and thus has a high ORP, namely an increased oxidizing power. The amount of the added oxidizing agent is adjusted so that pH value x and ORP value y (mV) of slurry 17 satisfy both of the relations y≧−50x+1000 (expression (i)) and y≦−50x+1900 (expression (ii)).

The oxidizing agent added to the slurry is not limited to a particular one. However, in terms of increasing the polishing speed, hypochlorous acid, such a chlorinated isocyanuric acid as trichloroisocyanuric acid, such a chlorinated isocyanurate as sodium dichloroisocyanurate, such a permanganate as potassium permanganate, such a dichromate as potassium dichromate, such a bromate as potassium bromate, such a thiosulfate as sodium thiosulfate, such a persulfate as ammonium persulfate and potassium persulfate, nitric acid, oxygenated water and ozone, for example, are preferably used. These oxidizing agents may be used singly or two or more of the oxidizing agents may be used.

Preferably the pH of slurry 17 in the present embodiment is at most 5 or at least 9. An acid slurry having a pH of 5 or less or a basic slurry having a pH of 9 or more may be brought into contact with a nitride crystal to promote oxidation of work-affected layer 1a of the nitride crystal, thereby increasing the polishing speed. In view of this, preferably the pH of slurry 17 is at most 4 and more preferably at most 2. Still preferably, the pH of slurry 17 is at least 10.

The acid and base used as the pH regulating agent are not limited to a particular one. For example, such inorganic acids as hydrochloric acid, nitric acid, sulfuric acid, phosphoric acid and carbonic acid, such organic acids as formic acid, acetic acid, citric acid, malic acid, tartaric acid, succinic acid, phthalic acid and fumaric acid, such bases as KOH, NaOH, NH$_4$OH and amine may be used, or a salt containing these acids or bases may be used. Further, the above described oxidizing agent may be added to adjust the pH.

In particular, by using, as the pH regulating agent, any organic acid as described above and/or a salt thereof, a higher polishing speed for the nitride crystal can be obtained, as compared with the case where any inorganic acid as described above and/or a salt thereof is used for obtaining the same pH. In terms of increasing the polishing speed, preferably the organic acid and/or a salt thereof is a carboxylic acid containing two or more carboxyl groups per molecule and/or a salt thereof. Preferred dicarboxylic acids are malic acid, succinic acid, phthalic acid and tartaric acid, for example. A preferred tricarboxylic acid is citric acid for example. Therefore, it is preferable that the slurry includes the abrasive grains, the oxidizing agent, the organic acid and/or a salt thereof as described above.

Second Embodiment

Figure 2:
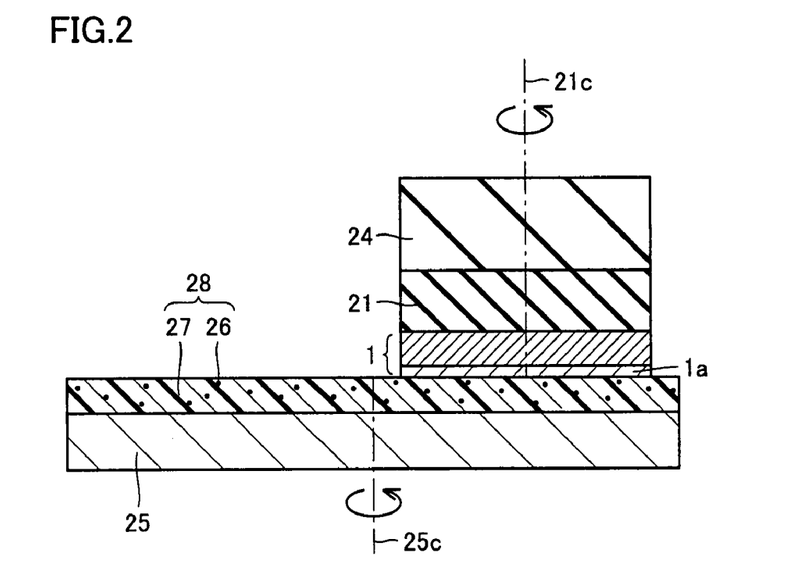
FIG. 2 is a schematic cross section showing another embodiment of the surface treatment method for a nitride crystal according to the present invention.

According to the present invention, referring to FIG. 2, another embodiment of the surface treatment method for a nitride crystal is a surface treatment method of chemically and mechanically polishing a surface of nitride crystal 1. Oxide abrasive grains 26 are used, the converted standard free energy of formation of abrasive grains 26 is at least −850 kJ/mol, and the Mohs hardness of abrasive grains 26 is at least 4. Here, the abrasive grains in the present embodiment are similar to abrasive grains in the first embodiment.

A feature of the CMP in the present embodiment is that the abrasive grains are directly used or fixed by a binder for use them in a solid state to perform the CMP as dry CMP, instead of performing the CMP as wet CMP using the abrasive grains in the liquid form as slurry in the first embodiment. The abrasive grains in the present embodiment have a converted standard energy of formation of at least −850 kJ/mol. Therefore, even if the abrasive grains are not in the form of the slurry as those in the first embodiment, the abrasive grains themselves have a high chemical polishing effect, which is derived from the oxidizing action, on a surface of a nitride crystal. Further, the abrasive grains in the present embodiment have a Mohs hardness of at least 4 and thus have a mechanical polishing effect in addition to the chemical polishing effect. Therefore, the polishing in the dry form as described above may also be used to perform the CMP on the nitride crystal.

Referring to FIG. 2, for example, the CMP in the present embodiment can be performed as described below. Abrasive grains 26 are fixed by a binder 27 to form a fixed abrasive grain body 28 such as an abrasive, polishing pad and polishing tape. While fixed abrasive grain body 28 secured onto a surface plate 25 is rotated about a rotational axis 25c, a crystal holder 21 to which a nitride crystal 1 is secured and on which a weight 24 is placed is rotated about its rotational axis 21c and nitride crystal 1 is pressed against fixed abrasive grain body 28. In this way, the surface of nitride crystal 1 can be chemically and mechanically polished.

Binder 27 is not limited to a particular one as long as it can fix abrasive grains 26. In terms of the abrasive-grain holding power and strength, preferably phenol resin, polyimide resin, polyamide resin, polyester resin, polyvinylalcohol resin, polyurethane resin, for example, may be used. The form of fixed abrasive grain body 28 is not limited to a particular one and may be any form such as abrasive, polishing pad or polishing tape.

By the dry CMP in the present embodiment, not only the fixed-abrasive-grain type CMP using fixed abrasive grain body 28 produced by fixing abrasive grains 26 by binder 27 as shown in FIG. 2, semi-fixed-abrasive-grain type CMP using abrasive grains 26 freed from fixed abrasive grain body 28 during the CMP as well as free-abrasive-grain type CMP using abrasive grains as they are can be performed. Further, for the free-abrasive-grain-type CMP, a composite abrasive grain generated by combining abrasive grains by means of the binder may be used. The binder for combining abrasive grains is not limited to a particular one. In terms of the abrasive-grain holding power, polyester resin, polyvinylalcohol resin or the like is preferably used.

For the surface treatment method in the first or second embodiment, preferably the CMP is followed by scrub cleaning of the chemically and mechanically polished surface of the nitride crystal using a neutral detergent. By the scrub cleaning using the neutral detergent, impurities (such as metal elements from abrasive grains for example) attached to the surface of the nitride crystal during the CMP can be removed easily. Further, not only impurities attached to the main surface of the substrate, impurities attached to the outer peripheral side surface of the substrate can be removed as well.

The neutral detergent here refers to a detergent having an almost neutral pH (pH in the range of 5 to 8.5 for example). The way in which the neutral detergent is used is not limited to a particular one. In terms of a high cleaning effect and easy removal of the detergent, preferably an aqueous solution in which the neutral detergent is diluted with water is used. Preferably, the concentration of the neutral detergent is at least 0.01% by mass and at most 2% by mass. The neutral detergent may be mixed with an acid or alkali to further enhance the cleaning effect.

The scrub cleaning refers to cleaning of impurities attached to the crystal surface by pressing a rotating brush (brush with bristles or sponge is used) against the crystal surface and moving the brush while a cleaning liquid is applied to the brush. The scrub cleaning may be performed manually by means of a cloth and a polishing pad.

In the case where the CMP (wet CMP) in the first embodiment is followed by the scrub cleaning using the neutral detergent, it is effective that the cleaning is performed before the substrate after the wet CMP dries.

For the surface treatment method in the first or second embodiment, preferably the CMP is followed by polishing of the surface of the chemically and mechanically polished nitride crystal, using a basic or acid solution. By performing polishing using a polishing liquid containing no solids like abrasive grains such as a basic solution or acid solution, impurities attached to the surface of the nitride crystal during the CMP can be removed easily.

The polishing method here is not limited to a particular one. For example, referring to FIG. 3, while a polishing pad 38 secured onto a surface plate 35 is rotated about a rotational axis 35c, a polishing liquid 37 is supplied from a polishing liquid feed port 39 onto polishing pad 38, a crystal holder 31 to which nitride crystal 1 is secured and on which a weight 34 is placed is rotated about its rotational axis 31c and nitride crystal 1 is pressed against polishing pad 38. In this way, impurities on the surface of nitride crystal 1 can be removed efficiently.

Figure 3:
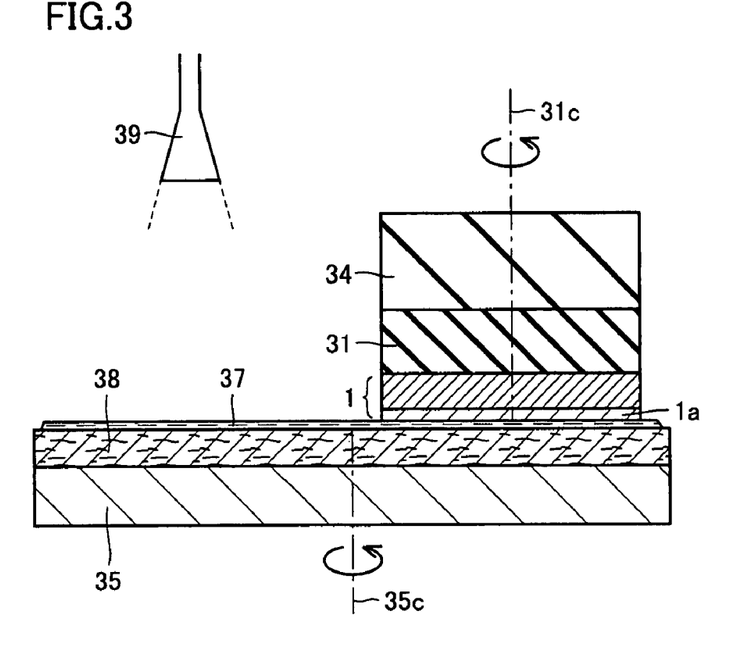
FIG. 3 is a schematic cross section showing an embodiment of polishing using a basic solution or acid solution that may be included in the surface treatment method for a nitride crystal according to the present invention.

Preferably, polishing liquid 37 is an acid solution having a pH of at most 5 or a basic solution having a pH of at least 9. The acid solution here is not limited to a particular one, and preferably such a solution of an inorganic acid such as hydrochloric acid, nitric acid, sulfuric acid and phosphoric acid, a solution of an organic acid such as formic acid, acetic acid, citric acid, malic acid, tartaric acid, succinic acid, phthalic acid, fumaric acid, or a solution containing at least two of the above-described inorganic acids and organic acids, for example, is used. While the basic solution is not limited to a particular one, preferably a solution of such a base as KOH, NaOH, NH$_4$OH and amine is used.

Further, for the surface treatment method for the nitride crystal in the present embodiment, preferably the CMP is followed by cleaning of the chemically and mechanically polished surface of the nitride crystal with pure water. By cleaning the nitride crystal surface with pure water, impurities attached to the nitride crystal surface during the CMP can be removed. The method of cleaning the nitride crystal with pure water is not limited to a particular one. In terms of effective removal of impurities by mechanical action, preferably such a method as ultrasonic cleaning method or scrub cleaning method is used.

Furthermore, for the surface treatment method for the nitride crystal in the first or second embodiment, the CMP may be followed by a combination of scrub cleaning with a neutral detergent, polishing with a basic or acid solution and cleaning with pure water. How the threes cleaning or polishing processes should be combined is not limited to a particular one. However, it is preferable that the step of cleaning with pure water is the final step, in terms of efficient and maximum removal of impurities on the nitride crystal surface by removing even those impurities from the basic solution, acid solution or neutral detergent.

For example, there may be a method according to which scrub cleaning with a neutral detergent or polishing with a basic or acid solution is followed by cleaning with pure water and a method according to which scrub cleaning with a neutral detergent, polishing with a basic or acid solution and cleaning with pure water are performed in this order. Particularly in the case where polishing with a basic or acid solution is followed by cleaning with pure water, preferably the ultrasonic cleaning method is used in terms of efficient removal of metal ions in the basic solution and acid solution and ions including light elements of atomic number 1 to 18.

In terms of enhancement of cleaning quality/power of the scrub cleaning with a neutral detergent, the polishing with a basic or acid solution and the cleaning with pure water, preferably metal elements contained in the abrasive grains used for the CMP have a high ionization tendency, and preferably the ionization tendency is higher than that of H.

Figure 4:
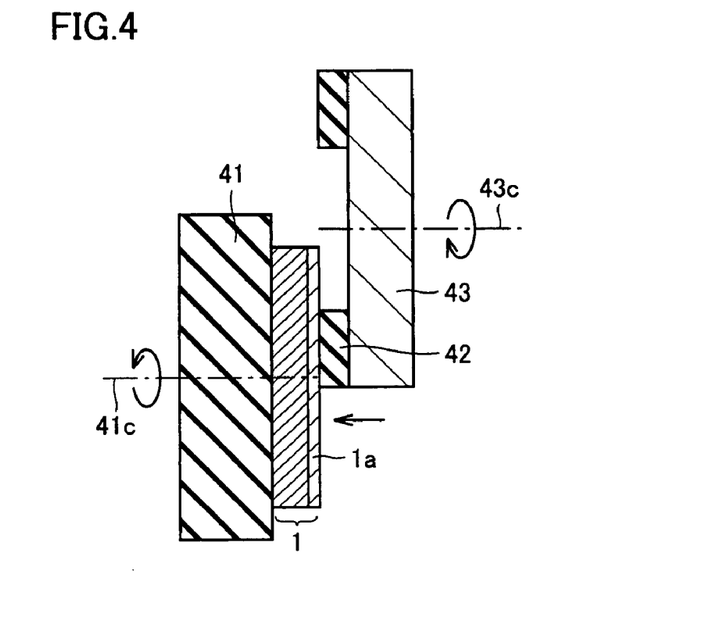
FIG. 4 is a schematic cross section showing an embodiment of grinding that may be included in the surface treatment method for a nitride crystal according to the present invention.
Figure 5:
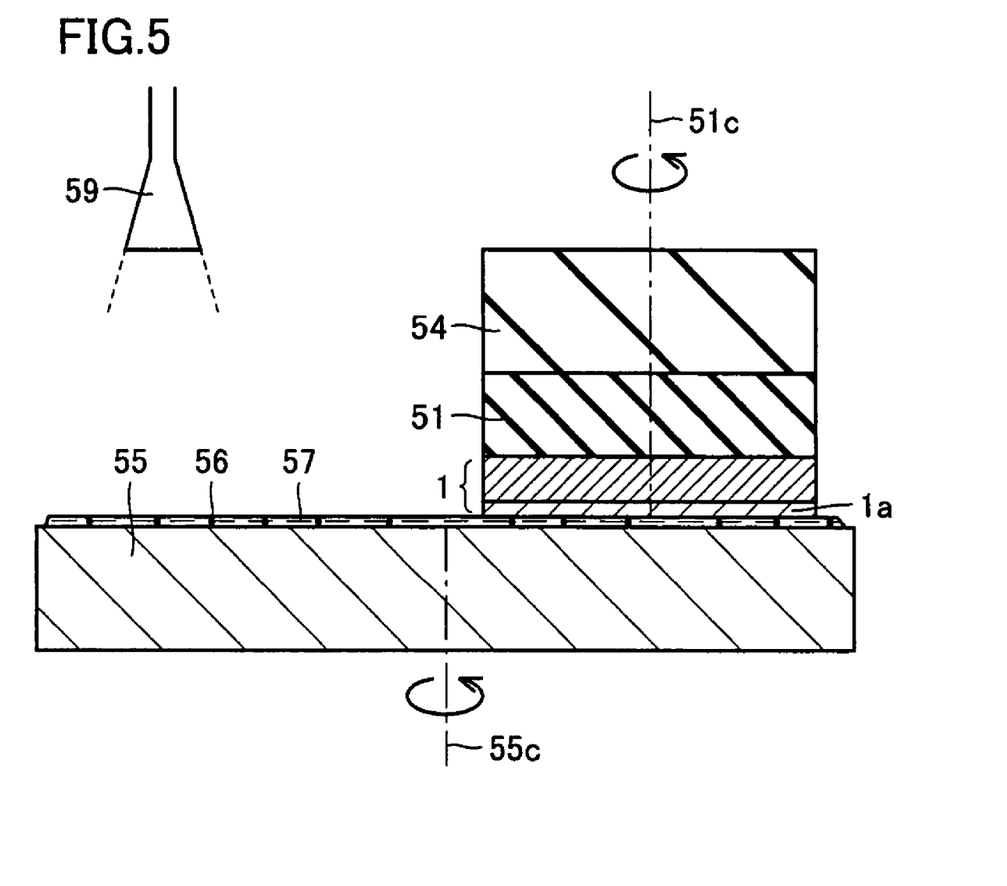
FIG. 5 is a schematic cross section showing an embodiment of lapping that may be included in the surface treatment method for a nitride crystal according to the present invention.

Regarding the surface treatment method for the nitride crystal in the first or second embodiment, with reference to FIGS. 1, 4 and 5, preferably grinding or lapping of the surface of nitride crystal 1 is performed before the CMP. By combining the grinding or lapping of the surface of the nitride crystal that is performed before the CMP, the speed of polishing the nitride crystal surface can be increased and the nitride crystal surface that is smooth and high quality can be formed.

The grinding here refers to the process of roughly removing the surface to smooth the surface and/or to adjust the thickness of the crystal. Referring to FIG. 4, for example, while an abrasive 42 including abrasive grains fixed by a binder is secured to an abrasive metal base 43 and the abrasive is rotated about a rotational axis 43c, the abrasive is fed to the surface of nitride crystal 1 secured to a crystal holder 41 and rotated about its rotational axis 41c, thereby chipping off the surface of nitride crystal 1 to smooth the surface, which is referred to as grinding.

The lapping here refers to rough polishing of the surface. Referring to FIG. 5, for example, while a surface plate 55 is rotated about its rotational axis 55c, a slurry 57 including abrasive grains 56 dispersed therein is supplied from a slurry feed port 59 onto surface plate 55, a crystal holder 51 to which nitride crystal 1 is secured and on which a weight 54 is put is rotated about its rotational axis 51c and nitride crystal 1 is pressed against surface plate 55, thereby smoothing the surface of nitride crystal 1. In the lapping process, instead of using the slurry having abrasive grains dispersed therein, an abrasive having the abrasive brains compacted with a bond may be rotated and pressed against the nitride crystal to polish the surface of the nitride crystal (not shown).

Third Embodiment

Figure 6:
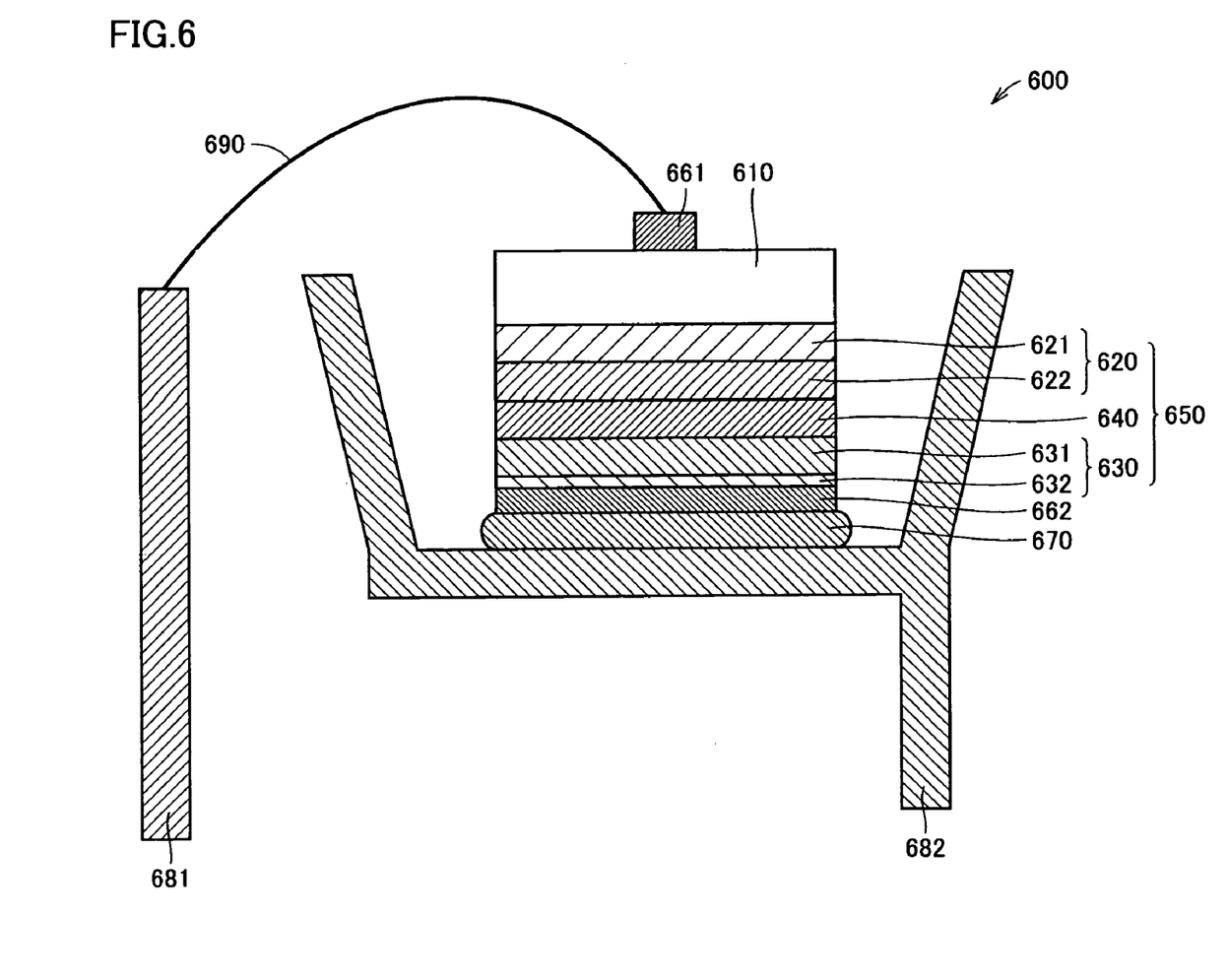
FIG. 6 is a schematic cross section showing an embodiment of a semiconductor device according to the present invention.

Referring to FIGS. 1, 2 and 6, an embodiment of a nitride crystal substrate of the present invention is a substrate of nitride crystal 1 produced by the surface treatment method in the first or second embodiment. By treating the surface of nitride crystal 1 according to the surface treatment method in the first or second embodiment, a nitride crystal substrate 610 is obtained that has a smooth an high-quality surface and that is appropriate as a substrate for a semiconductor device.

For the nitride crystal substrate in the present embodiment, under the conditions and using the combinations for the surface treatment method in the first or second embodiment, a nitride crystal substrate having a surface roughness Ry of at most 30 nm and/or a nitride crystal substrate having a surface roughness Ra of at most 3 nm can be obtained.

It is preferable that the nitride crystal substrate in the present embodiment has a surface roughness Ry of at most 30 nm. Here, surface roughness Ry is determined as follows. From a rough curved surface, a portion of a reference area of 10 μm×10 μm (=100 μm$^2$) is removed in the direction of an average plane, and the sum of the distance from the average plane to the highest peak and the distance from the average plane to the lowest valley of the removed portion is determined. This sum is surface roughness Ry. As the nitride crystal substrate has a surface roughness Ry of 30 nm or less, an epitaxial layer excellent in morphology and crystallinity can be formed on the surface of the nitride crystal substrate. In view of this, more preferably the nitride crystal substrate has a surface roughness Ry of at most 10 nm. Surface roughness Ry can be measured by means of an atomic force microscope (hereinafter AFM).

Further, it is preferable that the nitride crystal substrate in the present embodiment has a surface roughness Ra of at most 3 nm. Here, surface roughness Ra is determined as follows. From a rough curved surface, a portion of a reference area of 10 μm×10 μm is removed in the direction of an average plane. The sum of the absolute values of distances from the average plane to respective planes where measurements are taken of the removed portion is determined and the sum is averaged with the reference area. The result is surface roughness Ra. As a nitride crystal substrate has a surface roughness Ra of 3 nm or less, an epitaxial layer excellent in morphology and crystallinity can be formed on the surface of the nitride crystal substrate. In view of this, more preferably the nitride crystal substrate has a surface roughness Ra of at most 1 nm. Surface roughness Ra can be measured by means of an AFM.

Preferably, a main surface of the nitride crystal substrate in the present embodiment is parallel to any of {0001} plane, {11-20} plane, {01-12} plane, {10-10} plane, {10-11} plane, {11-21} plane and {11-22} plane of a wurtzite structure, or the off angle formed between the main surface of the nitride crystal substrate and any of the {0001} plane, {11-20} plane, {01-12} plane, {10-10} plane, {10-11} plane, {11-21} plane and {11-22} plane of the wurtzite structure is at most 15°. Here, {0001} plane is also called c-plane and refers to (0001) plane and its equivalent plane. {11-20} plane is also called a-plane and refers to (11-20) plane and its equivalent plane. {01-12} plane is also called r-plane and refers to (01-12) plane and its equivalent plane. {10-10} plane is also called m-plane and refers to (10-10) plane and its equivalent plane. {10-11} plane is also called s-plane and refers to (10-11) plane and its equivalent plane. {11-21} plane refers to (11-20) plane and its equivalent plane. {11-22} plane refers to (11-22) plane and its equivalent plane.

A nitride crystal having the wurtzite structure has a polarity in the [0001] direction (c-axis direction). Here, the c-axis is referred to as polar axis. A plane perpendicular to the polar axis (c-axis) is referred to as polar plane. In other words, the polar plane is defined as a plane where polarization occurs in the direction perpendicular to the polar plane. Further, a plane parallel to the polar axis (c-axis) is referred to a nonpolar plane. Furthermore, a plane that is not perpendicular to the polar axis (c-axis) but crosses the polar axis is referred to as semi-polar plane. A semiconductor device such as LED and LD (laser diode) using a nitride crystal substrate in which its main surface is a non-polar plane (such as {10-10} plane (m-plane) and {11-20} plane (a-plane) for example) can have a high luminous efficacy. In addition, when the applied current density is increased, blue shift in wavelength of emitted light (shift toward the shorter wavelengths) can be suppressed. Moreover, when a semiconductor device is to be fabricated, if it is desired to grow an epitaxial layer of high crystal quality on a main surface of a nitride crystal substrate, preferably the main surface is {10-11} plane (s-plane), {01-12} plane (r-plane), {11-21} plane, {11-22} plane that are semi-polar planes. When an LD is to be fabricated, since an end surface of a resonator is preferably the {10-10} plane (m-plane) or {0001} plane (c-plane) having cleavage property, it is preferable to use a nitride crystal substrate having its main surface perpendicular to the {10-10} plane (m-plane) (the main surface is for example {11-20} plane (a-plane), {11-21} plane, {11-22} plane, for example, or perpendicular to the {0001} plane (c-plane) (the main surface is for example {10-10} plane (m-plane), {11-20} plane (a plane)).

By providing the off angle, which is the angle formed between the main surface of the nitride crystal substrate and one of crystallographic planes mentioned above of the wurtzite structure, of at most 15°, formation is facilitated of an epitaxial layer excellent in morphology and crystallinity on the nitride crystal substrate. An off angle exceeding 15° is likely to result in a stepwise portion of the epitaxial layer. The off angle is preferably at least 0.05°. By providing an off angle of at least 0.05°, defects of an epitaxial layer formed on the nitride crystal substrate can be reduced. In view of this, the off angle is preferably at least 0.05° and at most 15°, and more preferably at least 0.1° and at most 10°. By forming, on the main surface of the nitride crystal substrate, an epitaxial layer excellent in morphology and crystallinity as described above, a semiconductor device of excellent characteristics can be obtained. Further, by providing the off angle as described above, the polishing speed is increased, and predominant removal in a region where dislocations concentratedly occur is suppressed to suppress generation of depressions, and thus formation of a smooth surface can be facilitated.

Fourth Embodiment

Referring to FIG. 6, an embodiment of a nitride crystal substrate having an epitaxial layer of the present invention includes a group III nitride layer 650 comprised of at least one layer formed by epitaxial growth on at least one main surface of nitride crystal substrate 610 in the third embodiment. The group III nitride layer including at least one layer is an epitaxial layer that is excellent in morphology and crystallinity. On such an epitaxial layer, a further epitaxial layer excellent in morphology and crystallinity may further be formed to facilitate fabrication of a semiconductor device with excellent characteristics.

Group III nitride layer 650 is not limited to a particular one and may be, for example, a $Ga_xAl_yIn_{1-x-y}N$ layer ($0 \leq x$, $0 \leq y$, $x+y \leq 1$). Further, the method of epitaxially growing the group III nitride layer is not limited to a particular one, and may be preferably the hydride vapor phase epitaxy (hereinafter HVPE) method, molecular beam epitaxy (hereinafter MBE) method, or metal organic chemical vapor deposition (hereinafter MOCVD) method, for example. Prior to the epitaxial growth of the group III nitride layer, etching and/or annealing of the nitride crystal substrate may be performed in an apparatus in which the epitaxial growth process is performed.

Fifth Embodiment

Referring to FIG. 6, an embodiment of the semiconductor device of the present invention is a semiconductor device 600 including nitride crystal substrate 610 of the third embodiment and group III nitride layer 650 comprised of at least one layer formed on at least one main surface of nitride crystal substrate 610. Semiconductor device 600 in the present embodiment has, on at least one main surface of nitride crystal substrate 610, group III nitride layer 650 comprised of at least one layer that is an epitaxial layer excellent in morphology and crystallinity is formed. Therefore, the semiconductor device has excellent characteristics.

Examples of such a semiconductor device include such light-emitting devices as light-emitting diode and laser diode, such electronic devices as rectifier, bipolar transistor, field-effect transistor and HEMT (High Electron Mobility Transistor), such semiconductor sensors as temperature sensor, pressure sensor, radiation sensor and visible-ultraviolet radiation detector, and SAW (Surface Acoustic Wave) device, for example.

Sixth Embodiment

Referring to FIG. 6, an embodiment of a method of manufacturing a semiconductor device of the present invention has the features that nitride semiconductor substrate 610 of the third embodiment is selected as a substrate for the semiconductor device, and group III nitride layer 650 comprised of at least one layer is formed on at least one main surface of nitride crystal substrate 610. By this manufacturing method, at least one layer of group III nitride layer 650 that is an epitaxial layer excellent in morphology and crystallinity is formed on at least one main surface of nitride crystal substrate 610 of the third embodiment. Thus, the semiconductor device of excellent characteristics and long life can be obtained.

EXAMPLES

Based on the following examples and comparative examples, a more specific description is given of a surface treatment method for a nitride crystal, a nitride crystal substrate obtained by the surface treatment method and a semiconductor device including the nitride crystal substrate.

Example 1

<1-1> Lapping of N-Type GaN Crystal Surface

An n-type GaN crystal (dopant: Si) grown by the HVPE method was sliced along a plane which is parallel to the (0001) plane to obtain an n-type GaN crystal substrate of diameter 50 mm×thickness 0.5 mm. Referring to FIG. 5, the c-plane on the N atomic plane side ((000-1) plane) of the n-type GaN crystal substrate (nitride crystal 1) was attached to crystal holder 51 made of a ceramic material using a wax. On a lapping apparatus (not shown), surface plate 55 of 300 mm in diameter was mounted. While slurry 57 including diamond abrasive grains 56 dispersed therein was supplied from slurry feed port 59 to surface plate 55, surface plate 55 was rotated about its rotational axis 55c, weight 54 provided on crystal holder 51 caused the n-type GaN crystal substrate (nitride crystal 1) to be pressed against surface plate 55 and the n-type GaN crystal substrate (nitride crystal 1) was rotated about rotational axis 51c of crystal holder 51. In this way, the surface (the c-plane on the Ga atomic plane side) was lapped.

As surface plate 55, copper surface plate or tin surface plate was used. Diamond abrasive grains of three types, namely those of 6 μm, 3 μm and 1 μm in abrasive grain size were prepared. As the lapping process proceeded, a smaller abrasive grain size was used step by step. The grinding pressure was 9.8 kPa (100 gf/cm$^2$) to 49 kPa (500 gf/cm$^2$). The rotational speed of the n-type GaN crystal substrate (nitride crystal 1) and that of surface plate 55 were each 30 revolutions/min to 100 revolutions/min.

By the lapping as described above, the surface of the n-type GaN crystal substrate was processed into a mirror-finished surface. A work-affected layer of the n-type GaN crystal substrate after being lapped had a thickness of 500 nm, a surface roughness Ry of 25 nm and a surface roughness Ra of 2.3 nm.

<1-2> CMP of N-Type GaN Crystal Surface

Referring to FIG. 1, the c-plane on the N atomic plane side ((000-1) plane) of the n-type GaN crystal substrate (nitride crystal 1) after being lapped as described above was attached to crystal holder 11 of a ceramic material with a wax. On surface plate 15 of 300 mm in diameter mounted on a polishing apparatus (not shown), polishing pad 18 was placed. While slurry 17 having dispersed abrasive grains 16 therein was supplied from slurry feed port 19 to polishing pad 18, polishing pad 18 was rotated about rotational axis 15c, weight 14 is put on crystal holder 11 to press the n-type GaN crystal substrate (nitride crystal 1) against polishing pad 18 and n-type GaN crystal substrate (nitride crystal 1) was rotated about rotational axis 11c of crystal holder 11. In this way, CMP was performed on the n-type GaN crystal surface (c-plane on the Ga atomic plane side, (0001) plane).

Slurry 17 was prepared as follows. As abrasive grains 16, particles of $Cr_2O_3$ (Mohs hardness 8.5, converted standard free energy of formation −770 kJ/mol) of 0.5 μm in grain size were dispersed in water. The content of $Cr_2O_3$ was 5% by mass. Sodium dichloroisocyanurate (hereinafter DCIA-Na) was added as an oxidizing agent and $HNO_3$ was added as a pH regulating agent to adjust the pH to 3 and the oxidation-reduction potential to 980 mV. As polishing pad 18, a polyurethane suede pad (Supreme RN-R, manufactured by Nitta Haas Incorporated) was used. As surface plate 15, a stainless steel surface plate was used. The polishing pressure was 19.6 kPa (200 gf/cm$^2$) to 98 kPa (1000 gf/cm$^2$). The rotational speed of the n-type GaN crystal substrate (nitride crystal 1) and that of polishing pad 18 were each 30 revolutions/min to 150 revolutions/min. The polishing time was 120 minutes.

The polishing speed for the CMP was high, which was 1.5 μm/hr. After the CMP, a work-affected layer of the n-type GaN crystal substrate was 100 nm in thickness, 10 nm in surface roughness Ry and 1.2 nm in surface roughness Ra. The thickness of the work-affected layer of the n-type GaN crystal substrate was evaluated by observing a cross section of the crystal broken along a cleavage plane with a transmission electron microscope (TEM). Surface roughness Ry and surface roughness Ra of the n-type GaN crystal substrate were evaluated by observing the surface of the n-type GaN crystal substrate over the range of 10 μm×10 μm by means of an atomic force microscope (AFM). The work-affected layer refers to a layer which is formed in a surface region of the crystal by grinding or polishing of the crystal surface and in which the crystal lattice is disordered. The presence and the thickness of the layer can be identified through TEM observation. The thickness of the surface oxidized layer of the n-type GaN crystal substrate after the CMP was 1.5 nm. The ratio between Ga atoms and N atoms in the surface of the n-type GaN crystal substrate was 50 atomic %:50 atomic %. The thickness of the surface oxidized layer was measured using an ellipsometer. The ratio between the Ga atoms and the N atoms was evaluated by the x-ray photoelectron spectroscopy (XPS).

<1-3> Manufacture of Semiconductor Device Including N-Type GaN Crystal Substrate Referring to FIG. 6, the n-type GaN crystal substrate after the CMP was provided in an MOCVD apparatus and, on one main surface ((0001) plane on which the CMP was performed) of the n-type GaN crystal substrate (nitride crystal substrate 610), an n-type GaN layer 621 (dopant: Si) of 1 μm in thickness and an n-type $Al_{0.1}Ga_{0.9}N$ layer 622 (dopant: Si) of 150 nm in thickness that are included in n-type semiconductor layer 620, a light-emitting layer 640, a p-type $Al_{0.2}Ga_{0.8}N$ layer 631 (dopant: Mg) of 20 nm in thickness and a p-type GaN layer 632 (dopant: Mg) of 150 nm in thickness that are included in p-type semiconductor layer 630, were formed successively by MOCVD to produce an LED (light-emitting diode) as a semiconductor device. Light-emitting layer 640 had the multiple quantum-well structure in which four barrier layers of GaN each having a thickness of 10 nm and three well layers of $Ga_{0.85}In_{0.15}N$ each having a thickness of 3 nm were alternately stacked on each other.

Then, on the other main surface ((000-1) plane) of the n-type GaN crystal substrate (nitride crystal substrate 610), a stacked structure comprised of a Ti layer of 200 nm in thickness, an Al layer of 1000 nm in thickness, a Ti layer of 200 nm in thickness and an Au layer of 2000 nm in thickness was formed as a first electrode 661. The electrode was heated in a nitrogen ambient to produce a n-side electrode of 100 μm in diameter. On p-type GaN layer 632, a stacked structure comprised of an Ni layer of 4 nm in thickness and an Au layer of 4 nm in thickness was formed as second electrode 662. The electrode was heated in an inert gas ambient to produce a p-side electrode. The stacked body was cut into a chip of 400 μm×400 μm. After this, the p-side electrode was bonded to a conductor 682 with a solder layer 670 of AuSn. Further, the n-side electrode and a conductor 681 were bonded with a wire 690 to produce semiconductor device 600 configured as an LED.

The optical output of the obtained LED (semiconductor device 600) was measured using an integrating sphere under the condition that the applied current was 20 mA. The optical output of the LED in the present embodiment was represented as a relative intensity of 1.0 and respective relative intensities of other embodiments are shown below. The results are summarized in Table 1.

Examples 2-6, Comparative Examples 1-5

The lapping and CMP were performed and the semiconductor device was manufactured similarly to Example 1 except that the abrasive grains, pH and ORP of the slurry used in the CMP were those shown in Table 1. The results are summarized in Table 1. As to the oxidizing agent in Table 1, DCIA-Na represents sodium dichloroisocyanurate. "Fracture hole" regarding Comparative Example 4 refers to a hole generated as a result of minute fracture of the crystal surface due to a mechanical load in the CMP. The depth of the fracture hole was measured using a light interference profilometer. Many of fracture holes had a depth of 50 nm or more.

TABLE 1

| | | | C.E. 1 | C.E. 2 | C.E. 3 | C.E. 4 | C.E. 5 | E. 1 | E. 2 | E. 3 | E. 4 | E. 5 | E. 6 |
|---|---|---|---|---|---|---|---|---|---|---|---|---|---|
| CMP | abrasive grains | contained chemical species | $Al_2O_3$ | $SiO_2$ | $CeO_2$ | SiC | CuO | $Cr_2O_3$ | $Fe_2O_3$ | $Fe_3O_4$ | NiO | ZnO | $Co_3O_4$ |
| | | Mohs hardness | 9 | 7 | 5 | 9.5 | 3.5 | 8.5 | 6 | 6 | 5.5 | 4 | 5 |
| | | converted standard free energy of formation (kJ/mol) | −1130 | −920 | −1030 | — | −340 | −770 | −570 | −580 | −500 | −720 | −470 |
| | | grain size (μm) | 0.5 | 0.2 | 0.2 | 9.5 | 1.0 | 0.5 | 0.3 | 0.5 | 1.0 | 2.0 | 1.0 |
| | oxidizing agent | | DCIA-Na | DCIA-Na | DCIA-Na | DCIA-Na | DCIA-Na | DCIA-Na | DCIA-Na | DCIA-Na | DCIA-Na | DCIA-Na | DCIA-Na |
| | acid, base, salt (pH regulating agent) | | $HNO_3$ | $HNO_3$ | $HNO_3$ | $HNO_3$ | $HNO_3$ | $HNO_3$ | $HNO_3$ | $HNO_3$ | $HNO_3$ | $HNO_3$ | $HNO_3$ |
| | pH of slurry | | 3.0 | 3.0 | 3.0 | 3.0 | 3.0 | 3.0 | 3.0 | 3.0 | 3.0 | 3.0 | 3.0 |
| | ORP of slurry (mV) | | 980 | 980 | 980 | 980 | 980 | 980 | 980 | 980 | 980 | 980 | 980 |
| | polishing speed (μm/hr) | | 0.8 | 0 | 0 | 0.9 | 0 | 1.5 | 0.5 | 0.5 | 0.4 | 0.3 | 0.6 |
| surface evaluation after CMP | surface roughness Ry (nm) | | 9.1 | 11 | 25 | 150 | 20 | 10 | 4.0 | 4.5 | 6.2 | 5.6 | 20 |
| | surface roughness Ra (nm) | | 0.86 | 0.91 | 2.8 | 9.5 | 1.8 | 1.2 | 0.42 | 0.48 | 0.53 | 0.45 | 2.1 |
| | thickness of work-affected layer (nm) | | 300 | 500 | 500 | 1200 | 500 | 100 | — | — | — | — | — |
| | notes | | | | | fracture hole | | | | | | | |
| relative light output intensity of LED | | | — | — | — | — | — | 1.0 | 2.8 | 2.1 | 1.6 | 1.7 | 2.2 |

* DCIA-Na: sodium dichloroisocyanurate
* C.E.: Comparative Example, E.: Example

Examples 7-12

The lapping and CMP were performed and the semiconductor device was manufactured similarly to Example 1 except that the abrasive grains, pH and ORP of the slurry used in the CMP were those shown in Table 2. The results are summarized in Table 2. As to the oxidizing agent in Table 2, DCIA-Na represents sodium dichloroisocyanurate. As to the contained chemical species of the abrasive grains in Table 2, $Fe_2O_3+SnO_2$ of Example 11 represents a mixture of chemical species $Fe_2O_3$ and $SnO_2$, and $NiO.Fe_2O_3$ of Example 12 represents a composite oxide $NiFe_2O_4$ composed of chemical species NiO and $Fe_2O_3$.

Examples 13, Comparative Example 6

<2-1> Grinding of N-Type GaN Crystal Substrate Surface

The n-type GaN crystal (dopant: Si) grown by the HVPE was sliced along a plane parallel to (0001) plane to obtain an n-type GaN crystal substrate of diameter 50 mm×thickness 0.5 mm. Referring to FIG. 4, the c-plane on the N atomic plane side ((000-1) plane) of the n-type GaN crystal substrate (nitride crystal 1) was bonded to ceramic crystal holder 21 with a wax. As a grinding machine, an in-feed type grinding machine was used. As abrasive 42, a vitrified bond diamond abrasive in the shape of a ring of outer diameter 80 mm×width 5 mm was used. The n-type GaN crystal substrate (nitride crystal 1) was secured to crystal holder 41 and rotated about its rotational axis 41c, while abrasive 42 fixed to abrasive metal base 43 was rotated about its rotational axis 43c and abrasive 42 was fed to the surface of the n-type GaN crystal. In this way, the surface (c-plane on the Ga atomic plane side, (0001) plane) of the n-type GaN crystal was ground. Diamond abrasives of four types including those with respective abrasive grain sizes of 15 μm, 5 μm, 3 μm and 1 μm were prepared and a smaller abrasive grain size was used step by step as the grinding proceeded. The grinding provided a mirror-finished surface to the surface of the n-type GaN crystal. The n-type GaN crystal substrate after the grinding had a work-affected layer with a thickness of 1500 nm, with surface roughness Ry of 79 nm and surface roughness Ra of 6.2 nm.

<2-2> CMP of GaN Crystal Substrate Surface

The CMP in Example 1 was performed on the lapped n-type GaN crystal substrate except that the slurry having the abrasive grains, pH and ORP as shown in Table 2 was used.

<2-3> Manufacture of Semiconductor Device Including N-Type GaN Crystal Substrate The n-type GaN crystal substrate after the above-described CMP was disposed in an MOCVD apparatus to manufacture the semiconductor device similarly to Example 1. The results are summarized in Table 2. As to the oxidizing agent in Table 2, "TCIA" represents trichloroisocyanuric acid.

TABLE 2

|  |  |  | E. 7 | E. 8 | E. 9 | E. 10 | E. 11 | E. 12 | C.E. 6 | E. 13 |
|---|---|---|---|---|---|---|---|---|---|---|
| CMP | abrasive grains | contained chemical species | $SnO_2$ | $GeO_2$ | $Ga_2O_3$ | $In_2O_3$ | $Fe_2O_3 + SnO_2$ | $NiO - Fe_2O_3$ | $Al_2O_3$ | $Cr_2O_3$ |
|  |  | Mohs hardness | 6.8 | 5 | 5 | 5 | 6, 6.8 | 5 | 9 | 8.5 |
|  |  | converted standard free energy of formation (kJ/mol) | −600 | −570 | −740 | −700 | −570, −600 | −560 | −1130 | −770 |
|  |  | grain size (μm) | 1.0 | 1.0 | 1.0 | 2.0 | 1.0, 1.0 | 3.0 | 0.5 | 0.5 |
|  | oxidizing agent |  | DCIA-Na | DCIA-Na | DCIA-Na | DCIA-Na | DCIA-Na | DCIA-Na | TCIA | TCIA |
|  | acid, base, salt (pH regulating agent) |  | $HNO_3$ | $HNO_3$ | $HNO_3$ | $HNO_3$ | $HNO_3$ | $HNO_3$ | malic acid | malic acid |
|  | pH of slurry |  | 3.0 | 3.0 | 3.0 | 3.0 | 3.0 | 3.0 | 2.0 | 2.0 |
|  | ORP of slurry (mV) |  | 980 | 980 | 980 | 980 | 980 | 980 | 1400 | 1400 |
|  | polishing speed (μm/hr) |  | 0.8 | 0.4 | 0.3 | 0.4 | 0.9 | 0.4 | 1.1 | 2.5 |
| surface evaluation after CMP | surface roughness Ry (nm) |  | 30 | 5.8 | 5.2 | 4.0 | 6.1 | 6.2 | 8.5 | 9.2 |
|  | surface roughness Ra (nm) |  | 3.0 | 0.54 | 0.49 | 0.39 | 0.58 | 0.55 | 0.78 | 0.80 |
|  | thickness of work-affected layer (nm) |  | — | — | — | — | — | — | 300 | 100 |
|  | notes |  |  |  |  |  |  |  |  |  |
| relative light output intensity of LED |  |  | 1.2 | 2.5 | 2.2 | 3.2 | 1.4 | 1.8 | — | 1.0 |

* DCIA-Na: sodium dichloroisocyanurate, TCIA: trichloroisocyanuric acid
* C.E.: Comparative Example, E.: Example As clearly seen from Table 1 and Table 2, by using, in the CMP process for surface treatment of the nitride crystal, the abrasive grains made of an oxide and having a converted standard free energy of formation of at least −850 kJ/mol and a Mohs hardness of at least 4, the nitride crystal substrate having the smooth and excellent-quality surface appropriate for the substrate of the semiconductor device was obtained.

In particular, the abrasive grains of Example 1 as compared with the abrasive grains of Comparative Example 1 had a converted standard free energy of formation of at least −850 kJ/mol while its hardness was low. Therefore, the higher polishing speed and the smoother crystal surface were obtained and the LED had a higher relative intensity of the optical output. Further, the abrasive grains of Example 2 as compared with the abrasive grains of Example 1 had a lower hardness, resulting in a somewhat lower polishing speed. However, the high converted standard free energy of formation provided the smoother crystal surface and higher relative intensity of the optical output of the LED.

Examples 14-22

The lapping and CMP were performed on the n-type GaN crystal substrate similarly to Example 2 except that the n-type GaN crystal (dopant: Si) grown by the HVPE was sliced so that a main surface was formed to have the off angle as shown in Table 3 relative to the plane having the plane orientation as shown in Table 3, and accordingly the n-type GaN crystal substrate of 10 mm×10 mm×thickness 0.5 mm was obtained. The results are summarized together with those for Example 2 in Table 3. As to the oxidizing agent in Table 3, TCIA represents trichloroisocyanuric acid.

or acid solution), and/or ultrasonic cleaning using pure water and ultrasonic waves of 1 MHz ($1\times10^6$ Hz) (cleaning with pure water) were performed.

The scrub cleaning using the neutral detergent as described above was carried out by pressing a sponge in which the neutral detergent was absorbed against the surface of the n-type GaN crystal substrate after the CMP and manually moving the sponge. The cleaning time was 1 minute.

The polishing was performed as follows. Specifically, on surface plate 35 mounted on a polishing apparatus (not shown) and having a diameter of 380 mm, polishing pad 38 was placed. While polishing liquid 37 was supplied from

TABLE 3

|  |  | E. 2 | E. 14 | E. 15 | E. 16 | E. 17 | E. 18 | E. 19 | E. 20 | E. 21 | E. 22 |
|---|---|---|---|---|---|---|---|---|---|---|---|
| substrate | plane orientation of main surface | (0001) c-Ga plane | (0001) c-Ga plane | (0001) c-Ga plane | (01-12) r-plane | (10-11) s-plane | (10-10) m-plane | (11-22) | (11-21) | (11-20) a-plane | (000-1) c-N plane |
|  | off angle (°) | 0 | 2 | 5 | 0 | 0 | 0 | 0 | 0 | 0 | 0 |
| CMP abrasive grains | contained chemical species | $Fe_2O_3$ | $Fe_2O_3$ | $Fe_2O_3$ | $Fe_2O_3$ | $Fe_2O_3$ | $Fe_2O_3$ | $Fe_2O_3$ | $Fe_2O_3$ | $Fe_2O_3$ | $Fe_2O_3$ |
|  | Mohs hardness | 6 | 6 | 6 | 6 | 6 | 6 | 6 | 6 | 6 | 6 |
|  | converted standard free energy of formation (kJ/mol) | −570 | −570 | −570 | −570 | −570 | −570 | −570 | −570 | −570 | −570 |
|  | grain size (μm) | 1.2 | 1.2 | 1.2 | 1.2 | 1.2 | 1.2 | 1.2 | 1.2 | 1.2 | 1.2 |
|  | oxidizing agent | TCIA | TCIA | TCIA | TCIA | TCIA | TCIA | TCIA | TCIA | TCIA | TCIA |
|  | acid, base, salt (pH regulating agent) | HCl | HCl | HCl | HCl | HCl | HCl | HCl | HCl | HCl | HCl |
|  | pH of slurry | 1.8 | 1.8 | 1.8 | 1.8 | 1.8 | 1.8 | 1.8 | 1.8 | 1.8 | 1.8 |
|  | ORP of slurry (mV) | 1450 | 1450 | 1450 | 1450 | 1450 | 1450 | 1450 | 1450 | 1450 | 1450 |
|  | polishing speed (μm/hr) | 0.8 | 1.0 | 1.2 | 1.6 | 1.8 | 3.1 | 1.8 | 2.3 | 3.0 | 5.2 |
| surface evaluation after CMP | surface roughness Ry (nm) | 4.0 | 3.2 | 2.7 | 3.0 | 3.2 | 3.5 | 3.1 | 3.4 | 3.8 | 4.3 |
|  | surface roughness Ra (nm) | 0.42 | 0.34 | 0.28 | 0.31 | 0.33 | 0.35 | 0.32 | 0.35 | 0.36 | 0.41 |
|  | thickness of work-affected layer (nm) | — | — | — | — | — | — | — | — | — | — |
|  | notes |  |  |  |  |  |  |  |  |  |  |

* TCIA: trichloroisocyanuric acid
* E.: Example

As clearly seen from Table 3, by performing the CMP of the present invention on the nitride crystal substrate having an off angle of at most 15°, which was the angle formed between the main surface of the nitride crystal substrate and any of {0001} plane, {11-20} plane, {01-12} plane, {10-10} plane, {10-11} plane, {11-21} plane and {11-22} plane of a wurtzite structure, the nitride crystal substrate having the smooth and excellent-quality surface was efficiently produced.

From a comparison between Examples 2, 14 and 15, it is seen that, as the off angle relative to the c-plane is increased from 0° to 2° and 5°, the polishing speed becomes higher. Further, from a comparison between Examples 2 and 16 to 22, it is seen that the polishing speed of the CMP is higher in the following order: (000-1) plane (N atomic plane of the c-plane (c-N plane in Table 3))>{10-10} plane (m-plane)>{11-20} plane (a-plane)>{11-21} plane>{11-22} plane={10-11} plane (s-plane)>{01-12} plane (r-plane)>(0001) plane (Ga atomic plane of the c-plane). It is considered that differences in chemical durability between these planes cause this result.

Examples 23-29

For the n-type GaN crystal substrate after the CMP in Example 1, the scrub cleaning using, as a neutral detergent, an aqueous solution of polyoxyalkylenealkylether (hereinafter also POAAE) of 0.15% by mass (scrub cleaning with neutral cleaning), polishing using, as a basic solution, a KOH aqueous solution having the concentration of 2N (normality) or, as an acid solution, an $H_2SO_4$ aqueous solution having the concentration of 0.5 N (normality) (polishing with basic solution polishing liquid feed port 39 to polishing pad 38, polishing pad 38 was rotated about rotational axis 35c. Further, while weight 34 was put on crystal holder 31 to press the n-type GaN crystal substrate (nitride crystal 1) against polishing pad 38, the n-type GaN crystal substrate (nitride crystal 1) was rotated about rotational axis 31c of crystal holder 31. In this way, the surface (c-plane ((0001) plane) on the Ga atomic plane side) of the n-type GaN crystal was polished. As polishing pad 38, a polyurethane suede pad (Supreme RN-R, manufactured by Nitta Haas Incorporated) was used. As surface plate 35, a stainless steel surface plate was used. The polishing pressure was 19.6 kPa (200 gf/cm²) to 49 kPa (500 gf/cm²). The rotational speed of the n-type GaN crystal substrate (group III nitride crystal 1) and that of polishing pad 38 were each 30 revolutions/min to 100 revolutions/min. The polishing time was 20 minutes.

The cleaning with pure water was performed as follows. After the CMP, the n-type GaN crystal substrate after the scrub cleaning with a neutral detergent or after the polishing with basic solution or acid solution was immersed in pure water and ultrasonic waves of 1 MHz were applied to the pure water. The cleaning time was 20 minutes.

Impurities remaining on the surface of the n-type GaN crystal substrate after the scrub cleaning with a neutral detergent, the polishing and/or the cleaning with pure water were subjected to element analysis by the TXRF (Total Reflection X-ray Fluorescence) analysis. The results are summarized in Table 4. As to the cleaning with a neutral detergent in Table 4, POAAE represents polyoxyalkylenealkylether.

TABLE 4

|  |  | E. 1 | E. 23 | E. 24 | E. 25 | E. 26 | E. 27 | E. 28 | E. 29 |
|---|---|---|---|---|---|---|---|---|---|
| surface treatment process after CMP | cleaning with neutral detergent (mass %) | — | POAAE (0.15) | — | — | — | POAAE (0.15) | — | POAAE (0.15) |
|  | polishing with basic or acid solution (N) | — | — | KOH (2) | $H_2SO_4$ (0.5) | — | — | malic acid (1) | KOH (2) |
|  | cleaning with pure water | — | — | — | — | ultrasound | ultrasound | ultrasound | ultrasound |
| amount of impurities on crystal surface ($\times 10^{10}$ atoms/$cm^2$) | Cr | 1800 | 400 | 700 | 300 | 600 | 150 | 200 | 0 |
|  | Si | 410 | 370 | 50 | 30 | 380 | 330 | 20 | 10 |
|  | K | 110 | 90 | 10 | 30 | 20 | 15 | 0 | 0 |
|  | S | 710 | 680 | 100 | 1100 | 280 | 220 | 40 | 30 |
|  | Cu | 630 | 410 | 220 | 160 | 380 | 280 | 100 | 50 |
|  | Ca | 2500 | 2100 | 80 | 30 | 420 | 350 | 30 | 0 |

\* POAAE: polyoxyalkylenealkylether
\* E.: Example

As clearly seen from Table 4, by performing, after the CMP, at least any of the scrub cleaning with a neutral detergent, the polishing with basic solution or acid solution and the cleaning with pure water, impurities on the surface of the n-type GaN crystal substrate could be reduced. Further, by combining these cleaning processes or polishing process, impurities on the surface of the n-type GaN crystal substrate could further be reduced.

Examples 30-37, Comparative Examples 7-9

The n-type AlN crystal (dopant: Si) grown by the HVPE method was sliced along a plane parallel to (0001) plane to obtain an n-type AlN crystal substrate of diameter 40 mm×thickness 0.5 mm. On the surface (c-plane on the Ga atomic plane side, (0001) plane) of n-type AlN crystal substrate, the lapping similar to Example 1 was performed. Then, on the lapped surface of the n-type AlN crystal substrate, the CMP was performed similarly to Example 1 except that the slurry having the abrasive grains, pH and ORP as shown in Table 5 was used. Subsequently, using the n-type AlN crystal substrate after the CMP, a semiconductor device was manufactured similarly to Example 1. The results are summarized in Table 5.

From a comparison between Table 5 and Tables 1 and 2, it is clearly seen that the surface treatment for the nitride crystal of the present invention can provide the CMP of high polishing speed so that the smooth and high-quality crystal surface can be obtained when the n-type AlN crystal substrate is used as well, similarly to the case where the n-type GaN crystal substrate is used. Further, like the n-type GaN crystal substrate, the n-type AlN crystal substrate has a higher light transmittance for a short-wavelength range, and thus an LED of high optical output can be obtained.

Example 38

<3-1> Lapping of N-Type GaN Crystal Surface

An n-type GaN crystal (dopant: Si) grown by the HVPE method was sliced along a plane parallel to (0001) plane to obtain an n-type GaN crystal substrate of diameter 30 mm×thickness 0.5 mm. On this n-type GaN crystal substrate, the lapping similar to Example 1 was performed. After the lapping, the n-type GaN crystal substrate had a work-affected layer having a thickness of 500 nm, a surface roughness Ry of 22 nm and a surface roughness Ra of 2.1 nm.

TABLE 5

|  |  |  | C.E. 7 | C.E. 8 | C.E. 9 | E. 30 | E. 31 | E. 32 | E. 33 | E. 34 | E. 35 | E. 36 | E. 37 |
|---|---|---|---|---|---|---|---|---|---|---|---|---|---|
| CMP | abrasive grains | contained chemical species | $Al_2O_3$ | $ZrO_2$ | CuO | $Cr_2O_3$ | $Fe_2O_3$ | $Fe_3O_4$ | NiO | ZnO | $SnO_2$ | $Co_3O_4$ | $In_2O_3$ |
|  |  | Mohs hardness | 9 | 7 | 3.5 | 8.5 | 6 | 6 | 5.5 | 4 | 6.8 | 5 | 5 |
|  |  | converted standard free energy of formation (kJ/mol) | −1130 | −920 | −340 | −770 | −570 | −580 | −500 | −720 | −600 | −470 | −700 |
|  |  | grain size (μm) | 0.5 | 0.2 | 1.0 | 0.5 | 1.2 | 1.0 | 1.0 | 2.0 | 1.0 | 1.0 | 2.0 |
|  | oxidizing agent |  | $H_2O_2$ | $H_2O_2$ | $H_2O_2$ | $H_2O_2$ | $H_2O_2$ | $H_2O_2$ | $H_2O_2$ | $H_2O_2$ | $H_2O_2$ | $H_2O_2$ | $H_2O_2$ |
|  | acid, base, salt (pH regulating agent) |  | HCl | HCl | HCl | HCl | HCl | HCl | HCl | HCl | HCl | HCl | HCl |
|  | pH of slurry |  | 4 | 4 | 4 | 4 | 4 | 4 | 4 | 4 | 4 | 4 | 4 |
|  | ORP of slurry (mV) |  | 850 | 850 | 850 | 850 | 850 | 850 | 850 | 850 | 850 | 850 | 850 |
|  | polishing speed (μm/hr) |  | 0.6 | 0.2 | 0 | 1.2 | 0.5 | 0.5 | 0.4 | 0.2 | 0.7 | 0.5 | 0.4 |
| surface evaluation after CMP | surface roughness Ry (nm) |  | 8.1 | 4.5 | 15 | 8.2 | 3.8 | 3.9 | 5.8 | 4.6 | 24 | 15 | 3.8 |
|  | surface roughness Ra (nm) |  | 0.75 | 0.41 | 1.1 | 0.81 | 0.39 | 0.39 | 0.49 | 0.42 | 2.2 | 1.2 | 0.36 |
|  | thickness of work-affected layer (nm) |  | 300 | 250 | 500 | 100 | — | — | — | — | — | — | — |
|  | notes |  |  |  |  |  |  |  |  |  |  |  |  |
| relative light output intensity of LED |  |  | — | — | — | 1.2 | 3.2 | 3.1 | 1.6 | 1.8 | 1.3 | 1.4 | 2.2 |

\* C.E.: Comparative Example, E.: Example

<3-2> CMP of N-Type GaN Crystal Surface

Referring to FIG. 2, the c-plane on the N atomic plane side ((000-1) plane) of the n-type GaN crystal substrate (nitride crystal 1) after the lapping was bonded to ceramic crystal holder 21 with a wax. Fixed abrasive grain body 28 including abrasive grains 26 and secured to surface plate 25 of 300 mm in diameter mounted on a polishing apparatus (not shown) was rotated about rotational axis 25c. Further, weight 24 was put on crystal holder 21 to which nitride crystal 1 was secured and the holder was rotated about its rotational axis 21c, while nitride crystal 1 was pressed against fixed abrasive grain body 28. In this way, the CMP was performed on the surface (c-plane on the Ga atomic plane side, (0001) plane) of the n-type GaN crystal.

Fixed abrasive grain body 28 was formed by fixing, using binder 27 that was polyvinyl alcohol resin, abrasive grains 26 that were $Cr_2O_3$ (Mohs hardness: 8.5, converted standard free energy of formation: −770 kJ/mol) particles having a grain size of 0.5 μm. The content of the abrasive grains in fixed abrasive grain body 28 was 15% by mass. The polishing pressure was 19.6 kPa (200 gf/cm$^2$) to 147 kPa (1500 gf/cm$^2$). The rotational speed of the n-type GaN crystal substrate (nitride crystal 1) and that of fixed abrasive grain body 28 were each 50 revolutions/min to 400 revolutions/min. The polishing time was 60 minutes.

The CMP had a high polishing speed of 3.2 nm/hr. After the CMP, the n-type GaN crystal substrate had a work-affected layer with a thickness of 150 nm, a surface roughness Ry of 10 nm and a surface roughness Ra of 1.2 nm.

<3-3> Manufacture of Semiconductor Device Including N-Type GaN Crystal Substrate The n-type GaN crystal substrate after the CMP was used to manufacture a semiconductor device similarly to Example 1. The results are summarized in Table 6.

Examples 39-44, Comparative Examples 10-14

The lapping and the CMP were performed and the semiconductor device was manufactured similarly to Example 38 except that the abrasive grains and binder material shown in Table 6 or 7 were used for the CMP. The results are summarized in Table 6 and Table 7. In Table 6 and Table 7, Ph as a binder material for the CMP represents phenol resin, PVA represents polyvinyl alcohol resin, PI represents polyimide resin, PA represents polyamide resin and PE represents polyester resin. "Fracture hole" regarding Comparative Example 13 refers to a hole generated as a result of minute fracture of the crystal surface due to a mechanical load in the CMP. The depth of the fracture hole was measured using a light interference profilometer. Many of fracture holes had a depth of 50 nm or more.

TABLE 6

| | | | C.E. 10 | C.E. 11 | C.E. 12 | C.E. 13 | C.E. 14 | E. 38 | E. 39 | E. 40 |
|---|---|---|---|---|---|---|---|---|---|---|
| CMP | abrasive grains | contained chemical species | $Al_2O_3$ | $SiO_2$ | $CeO_2$ | SiC | CuO | $Cr_2O_3$ | $Fe_2O_3$ | $Fe_3O_4$ |
| | | Mohs hardness | 9 | 7 | 5 | 9.5 | 3.5 | 8.5 | 6 | 6 |
| | | converted standard free energy of formation (kJ/mol) | −1130 | −920 | −1030 | — | −340 | −770 | −570 | −580 |
| | | grain size (μm) | 0.5 | 0.2 | 0.2 | 9.5 | 1.0 | 0.2 | 0.3 | 0.5 |
| | material for binder | | Ph | Ph | PVA | PI | PA | PVA | PVA | Ph |
| | polishing speed (μm/hr) | | 1.5 | 0 | 0 | 2.0 | 0 | 3.2 | 1.1 | 0.9 |
| surface evaluation after CMP | surface roughness Ry (nm) | | 42 | 33 | 28 | 340 | 22 | 10 | 4.2 | 4.1 |
| | surface roughness Ra (nm) | | 3.9 | 3.1 | 2.4 | 22 | 2.0 | 1.2 | 0.36 | 0.35 |
| | thickness of work-affected layer (nm) | | 400 | 500 | 500 | 1200 | 500 | 150 | 50 | 50 |
| | notes | | | | | fracture hole | | | | |
| relative light output intensity of LED | | | — | — | — | — | — | 0.8 | 1.5 | 1.5 |

* Ph: phenol resin, PVA: polyvinylalcohol resin, PI: polyimide resin, PA: polyamide resin
* C.E.: Comparative Example, E.: Example

TABLE 7

| | | | E. 41 | E. 42 | E. 43 | E. 44 |
|---|---|---|---|---|---|---|
| CMP | abrasive grains | contained chemical species | NiO | $SnO_2$ | $Co_3O_4$ | $Ga_2O_3$ |
| | | Mohs hardness | 5.5 | 6.8 | 5 | 5 |
| | | converted standard free energy of formation (kJ/mol) | −500 | −600 | −470 | −740 |
| | | grain size (μm) | 1.0 | 1.0 | 1.0 | 1.0 |
| | material for binder | | PE | PE | PI | PVA |
| | polishing speed (μm/hr) | | 0.8 | 1.2 | 1.0 | 0.8 |
| surface evaluation after CMP | surface roughness Ry (nm) | | 7.2 | 39 | 28 | 7.5 |
| | surface roughness Ra (nm) | | 0.65 | 3.3 | 2.5 | 0.82 |
| | thickness of work-affected layer (nm) | | 50 | 50 | 50 | 50 |
| | notes | | | | | |
| relative light output intensity of LED | | | 1.4 | 1.2 | 1.2 | 1.3 |

* PE: polyester resin, PI: polyimide resin, PVA: polyvinylalcohol resin
* E.: Example As clearly seen from Table 6 and Table 7, for the dry CMP for the surface treatment method for the nitride crystal as well, abrasive grains made of an oxide and having a converted standard free energy of formation of at least −850 kJ/mol and a Mohs hardness of at least 4 can be used to obtain the nitride crystal substrate having the smooth and high-quality surface appropriate for the semiconductor device substrate.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A surface treatment method of chemically and mechanically polishing a surface of a nitride crystal,
   using abrasive grains of an oxide,
      said abrasive grains having a standard free energy of formation of at least −850 kJ/mol as a converted value per 1 mole of oxygen molecules, and said abrasive grains having a Mohs hardness of at least 4, wherein
   said surface of the nitride crystal that is chemically and mechanically polished is cleaned with pure water.

2. The surface treatment method according to claim 1, wherein
   said abrasive grains are dispersed in a solvent to be used as a slurry, and
   a pH value x and an oxidation-reduction potential value y (mV) of said slurry satisfy both of relations (i) and (ii):

$$y \geq 50x+1000 \tag{i}$$

$$y \geq 50x+1900 \tag{ii}$$

3. The surface treatment method according to claim 1, wherein said slurry has a pH of at most 5 or at least 9.

4. The surface treatment method according to claim 1, wherein
   said abrasive grains are abrasive grains containing at least one chemical species selected from the group consisting of $Fe_2O_3$, $Fe_3O_4$, NiO, ZnO, CoO, $Co_3O_4$, $GeO_2$, $Ga_2O_3$, $In_2O_3$, $Cr_2O_3$ and $SnO_2$.

5. The surface treatment method according to claim 1, wherein
   said surface of the nitride crystal that is chemically and mechanically polished is scrub-cleaned using a neutral detergent.

6. The surface treatment method according to claim 1, wherein
   said surface of the nitride crystal that is chemically and mechanically polished is polished using a basic solution or acid solution.

7. The surface treatment method according to claim 1, wherein
   said surface of the nitride crystal is subjected to grinding or lapping before chemically and mechanically polished.

8. A nitride crystal substrate obtained by surface treatment of chemically and mechanically polishing a surface of a nitride crystal,
   said surface treatment using abrasive grains of an oxide, said abrasive grains having a standard free energy of formation of at least −850 kJ/mol as a converted value per 1 mole of oxygen molecules and said abrasive grains having a Mohs hardness of at least 4, wherein
   said surface of the nitride crystal that is chemically and mechanically polished is cleaned with pure water.

9. The nitride crystal substrate according to claim 8, wherein said nitride crystal substrate has a surface roughness Ry of at most 30 nm.

10. The nitride crystal substrate according to claim 8, wherein said nitride crystal substrate has a surface roughness Ra of at most 3 nm.

11. The nitride crystal substrate according to claim 8, wherein
   an off angle formed by a main surface of said nitride crystal substrate and any of {0001} plane, {11-20} plane, {01-12} plane, {10-10} plane, {10-11} plane, {11-21} plane and {11-22} plane of a wurtzite structure is at most 15°.

12. A nitride crystal substrate having an epitaxial layer, comprising a group III nitride layer (650) of at least one layer formed through epitaxial growth on at least one main surface of the nitride crystal substrate as recited in claim 8.

13. A semiconductor device comprising the nitride crystal substrate as recited in claim 8 and a group III nitride layer of at least one layer formed on at least one main surface of said nitride crystal substrate.

14. A method of manufacturing a nitride crystal substrate having an epitaxial layer, selecting the nitride crystal substrate as recited in claim 8 as a substrate and growing a group III nitride layer of at least one layer on at least one main surface of said nitride crystal substrate.

15. A method of manufacturing a semiconductor device, selecting the nitride crystal substrate as recited in claim 8 as a substrate and growing a group III nitride layer of at least one layer on at least one main surface of said nitride crystal substrate.

* * * * *